(12) United States Patent
Hahl et al.

(10) Patent No.: US 9,372,217 B2
(45) Date of Patent: Jun. 21, 2016

(54) CABLE DETECTOR

(75) Inventors: Markus Hahl, Korntal-Muenchingen (DE); Andrej Albrecht, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 560 days.

(21) Appl. No.: 13/995,706

(22) PCT Filed: Nov. 7, 2011

(86) PCT No.: PCT/EP2011/069539
§ 371 (c)(1),
(2), (4) Date: Sep. 16, 2013

(87) PCT Pub. No.: WO2012/084329
PCT Pub. Date: Jun. 28, 2012

(65) Prior Publication Data
US 2013/0342218 A1    Dec. 26, 2013

(30) Foreign Application Priority Data

Dec. 20, 2010  (DE) .......................... 10 2010 063 546

(51) Int. Cl.
*G01R 19/00*      (2006.01)
*G01V 3/08*       (2006.01)
(Continued)

(52) U.S. Cl.
CPC *G01R 29/08* (2013.01); *G01V 3/06* (2013.01); *G01V 3/08* (2013.01); *G01V 3/081* (2013.01); *G01R 33/0005* (2013.01)

(58) Field of Classification Search
CPC ...... G01R 29/08; G01R 33/0005; G01V 3/06; G01V 3/08; G01V 3/081
USPC .................................................. 324/67, 326
See application file for complete search history.

(56) References Cited

U.S. PATENT DOCUMENTS 4,639,674 A * 1/1987 Rippingale ............ G01V 3/081
324/326
5,477,154 A   12/1995 Takahashi et al.
(Continued)

FOREIGN PATENT DOCUMENTS

CN    1776437 A    5/2006
CN    1924591 A    3/2007
(Continued)

OTHER PUBLICATIONS

International Search Report corresponding to PCT Application No. PCT/EP2011/069539, mailed Nov. 7, 2012 (German and English language document) (6 pages).

*Primary Examiner* — Amy He
(74) *Attorney, Agent, or Firm* — Maginot, Moore & Beck LLP (57) ABSTRACT

A measuring device for detecting a conductor that carries alternating voltage, includes a voltage source configured to produce two phase-shifted alternating voltages, two complex impedance elements having first connections, which are connected to the alternating voltages, and second connections, which are connected to each other and to which a differential voltage is applied, and a control device configured to control the alternating voltages in such a way that a component of the differential voltage synchronous with the alternating voltages is minimized in magnitude. The control device is configured to detect the conductor if a ratio of the alternating voltages does not correspond to a ratio of the complex impedance elements in the absence of the conductor. The second complex impedance element is changeable with a control voltage. A probe is configured to provide the control voltage as a function of an alternating electromagnetic field induced by the conductor.

11 Claims, 4 Drawing Sheets

(51) Int. Cl.
*G01R 29/08* (2006.01)
*G01V 3/06* (2006.01)
*G01R 33/00* (2006.01)

(56) References Cited

U.S. PATENT DOCUMENTS

2010/0001731 A1* 1/2010 Royle .................... G01V 3/081
 324/326
2013/0300401 A1* 11/2013 Krapf .................... G01V 3/107
 324/201

FOREIGN PATENT DOCUMENTS

| | | |
|---|---|---|
| CN | 101354422 A | 1/2009 |
| CN | 101526628 A | 9/2009 |
| DE | 25 45 717 A1 | 4/1977 |
| DE | 36 23 045 A1 | 1/1988 |
| DE | 10 2005 007 803 A1 | 8/2006 |
| JP | 2002-207054 A | 7/2002 |
| WO | 03/073132 A1 | 9/2003 |
| WO | 2012/055641 A2 | 5/2012 |

* cited by examiner

CABLE DETECTOR

This application is a 35 U.S.C. §371 National Stage Application of PCT/EP2011/069539, filed on Nov. 7,2011, which claims the benefit of priority to Ser. No. DE 10 2010 063 546.4,filed of Dec. 20, 2012 in Germany, the disclosures of which are incorporated herein by reference in their entirety.

The disclosure relates to a measuring apparatus and to a measuring method for detecting a conductor carrying AC voltage, as described herein.

BACKGROUND

Cable detectors which can be used to detect, for instance, an electrical supply line concealed in a wall are known. This may be necessary, for example, if a hole is intended to be made in the wall without damaging the supply line in the process. An electromagnetic alternating field which exists in the region of the supply line is usually determined with the cable detector by means of an electrode.

However, measurement results which can be achieved with such cable detectors are often inaccurate and are not always reproducible. The disclosure is based on the object of specifying an improved measuring apparatus and an improved measuring method for detecting a conductor carrying AC voltage.

The disclosure achieves the objects using a measuring apparatus having the features described herein and using a measuring method as described herein.

SUMMARY

A measuring apparatus according to the disclosure for detecting a conductor carrying AC voltage comprises a push-pull measuring bridge with two complex impedances. One of the complex impedances can be changed using a control voltage which is provided by a probe on the basis of an electromagnetic alternating field induced by the conductor.

As a result, the known advantages of a push-pull measuring bridge can be used to determine an electromagnetic alternating field, with the result that the conductor carrying AC voltage can be accurately determined or located.

The probe may comprise an electrode for picking up an electrical component of the electromagnetic field of the conductor or a magnetic field sensor for picking up a magnetic component of the electromagnetic field. The electrical component is easier to influence, with the result that a wet wall in which the conductor is laid may make it difficult to locate the conductor, for example. The magnetic component is generally less easy to influence and, for that reason, may be very low and thus poorly detectable if a current flowing through the conductor is small.

In one embodiment, the other complex impedance can likewise be changed, and a device is provided for the purpose of changing the other complex impedance in the opposite direction to the change in the one complex impedance. This device may comprise, for example, an inverting amplifier which provides a control voltage, provided by the probe, in inverted form for the purpose of controlling the other complex impedance. This makes it possible to increase a dynamic response of the measuring apparatus.

In another embodiment, the control voltage for the other complex impedance may be provided by a further probe in the region of the conductor carrying AC voltage. This enables a differential measurement of the electromagnetic alternating field, thus making it possible to suppress common interfering signals and to improve determination of the conductor.

The conductor carrying AC voltage may be part of an AC voltage supply network, and one or more frequency filters may be provided in order to limit a frequency spectrum of the control voltage to a predetermined frequency range which comprises an operating frequency of the AC voltage supply network.

At least one of the controllable complex impedances preferably comprises a variable-capacitance diode, a bipolar transistor, a field effect transistor or a MOSFET.

A load element which can be connected to the line and is intended to generate a predetermined current through the line may be provided. This makes it possible to ensure a minimum current in the line, thus facilitating the determination using a magnetic field sensor.

The load element may be set up to vary the predetermined current in a predetermined manner, for example at a predetermined frequency or in another known profile, and the measuring apparatus may be set up to use only a component of a voltage provided by the respective probe to provide the control voltages for the complex impedances, which component varies in the predetermined manner. This makes it possible to distinguish the electromagnetic field of the line from electromagnetic fields of other lines, thus making it possible to further improve the localization of the line.

According to the disclosure, the conductor carrying AC voltage can be determined using a method which can run on a processing device, in particular in the form of a computer program product, or may be stored on a computer-readable data storage medium.

BRIEF DESCRIPTION OF THE DRAWINGS

The disclosure is now described in more detail with reference to the accompanying figures, in which.

DETAILED DESCRIPTION

Figure 1:
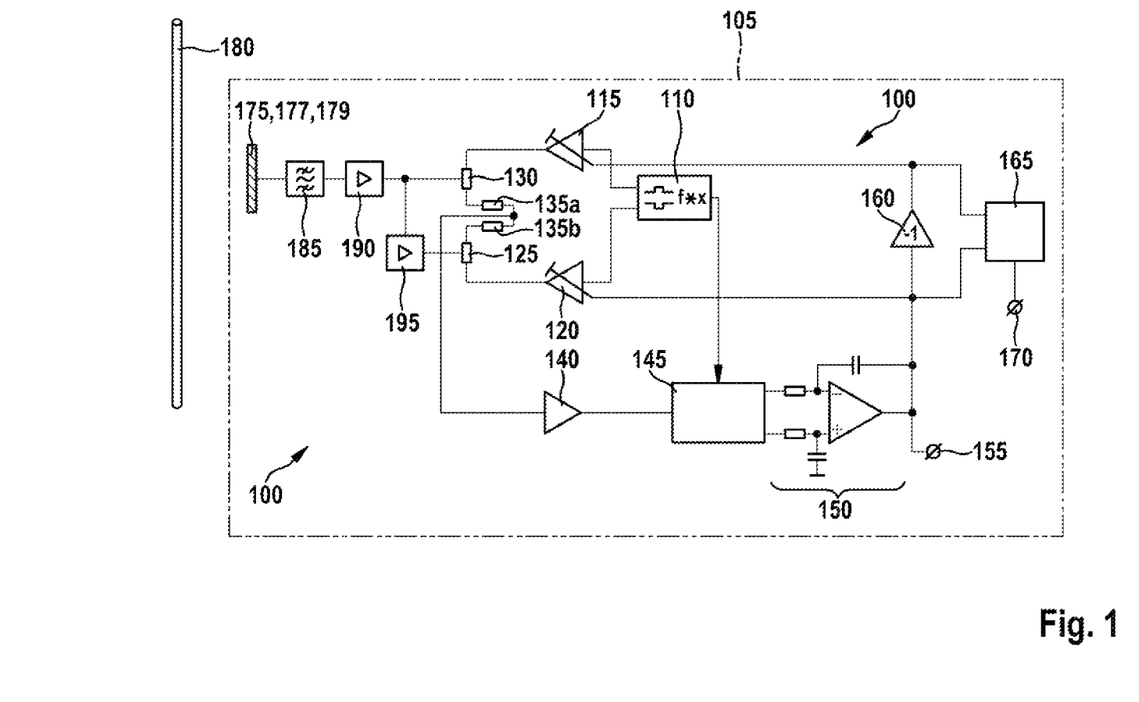
FIG. 1 shows a block diagram of a measuring apparatus.

FIG. 1 shows a block diagram of a measuring apparatus 100. The measuring apparatus 100 is part of a cable detector 105 for detecting a conductor carrying AC voltage, for example a 110 V/60 Hz line or a 230 V/50 Hz line or else a low-voltage line of 12 V/50-60 Hz, for example.

A clock generator 110 has two outputs at which it provides phase-shifted periodic alternating signals, preferably alternating signals which have been phase-shifted through 180°. The alternating signals may comprise, in particular, square-wave signals, triangular signals or sinusoidal signals. The outputs of the clock generator 110 are connected to a first controllable amplifier 115 and a second controllable amplifier 120. Each of the controllable amplifiers 115, 120 has a control input via which it receives a signal which controls a gain factor of the controllable amplifier 115, 120. An output of the first controllable amplifier 115 is connected to a first complex impedance 130 and an output of the second controllable amplifier 120 is connected to a second complex impedance 125. Each complex impedance 125, 130 may comprise, for example, an RC or LC element in a known manner. Remaining ends of the complex impedances 125 and 130 are connected to one another via two resistors 135a, 135b. In one embodiment, the resistors 135a and 135b are dispensed with and the remaining ends of the complex impedances 125, 130 are connected directly to one another. A differential voltage is applied to those ends of the resistors 135a, 135b which are connected to one another.

A connection to an input amplifier 140 runs from the resistors 135a, 135b which are connected to one another. The input amplifier 140 is illustrated with a constant gain factor; in other embodiments, however, a gain factor of the input amplifier 140 may also be controllable. This makes it possible, for example, to influence a spatial resolution and/or sensitivity of the measuring apparatus 100 and to control it, for example, on the basis of a measurement variable of the measuring apparatus 100.

The output of the input amplifier 140 is connected to a synchronous demodulator 145. The synchronous demodulator 145 is also connected to the clock generator 110 and receives, from the latter, a clock signal which indicates the phase angle of the signals provided at the outputs of the clock generator 110. In a simple embodiment in which the signals provided by the clock generator 110 are symmetrical square-wave signals, one of the output signals can be used as the clock signal. The synchronous demodulator 145 alternately switches through the measurement signal received from the input amplifier 140 to its upper and lower outputs substantially on the basis of the clock signal provided by the clock generator 110.

The two outputs of the synchronous demodulator 145 are connected to an integrator (integrating comparator) 150 which is constructed here, by way of example, in the form of an operational amplifier connected to two resistors and two capacitors. Other embodiments are likewise possible, for example in the form of an active low-pass filter. A digital embodiment of the integrating comparator 150 is also conceivable, in which the signal at the output of the synchronous demodulator is subjected to analog/digital conversion at one or more times within a half-cycle and is then compared with the corresponding value from the next half-cycle. The difference is integrated and is converted into an analog signal, for example, again and is used to control the amplifiers 115, 120. While the synchronous demodulator 145 provides the measurement signal received from the input amplifier 140 at its lower output, the integrator 150 integrates this signal over time and provides the result at its output. While the synchronous demodulator 145 provides the measurement signal received from the input amplifier 140 at its upper output, this signal is integrated by the integrator 150 over time in inverted form and the result is provided at the output of the integrator 150. The voltage at the output of the integrator 150 is the integral of the difference between the low-pass-filtered outputs of the synchronous demodulator 145.

A difference between the complex impedances 125 and 130 can be detected using the differential voltage which can be tapped off between the resistors 135a, 135b. If the values of the complex impedances 125, 130 are the same, the signals provided at the outputs of the synchronous demodulator 145 are also on average the same over time and a signal which tends toward zero (ground) is provided at the output of the integrator 150. However, if the values of the impedances 125, 130 differ, the signals provided at the outputs of the synchronous demodulator 145 are no longer the same on average and a positive or negative signal is provided at the output of the integrator 150.

The signal provided by the integrator 150 is provided for further processing via a connection 155. A microcomputer 165 may additionally be connected to the control inputs of the controllable amplifiers 115, 120. The microcomputer 165 compares the provided signal with a threshold value and outputs, at an output 170, a signal which indicates the metal object. The signal can be presented to a user of the cable detector 105 in an optical and/or acoustic manner.

The microcomputer 165 may also further process the signals tapped off from the control inputs of the controllable amplifiers 115, 120 and can control parameters of the measuring apparatus 100 on the basis thereof. For example, a frequency or signal waveform of the alternating voltages at the outputs of the clock generator 110 may be varied or a sensitivity of the receiving amplifier 140 may be changed. In another embodiment, further elements of the shown elements of the measuring apparatus 100 are implemented by the microcomputer 165, for instance the clock generator 110, the synchronous demodulator 145 or the integrator 150.

The same signal from the integrator 150 is also used to control the gain factors of the controllable amplifiers 115 and 120, the second controllable amplifier 120 being directly connected to the output of the integrator 150 and the first controllable amplifier 115 being connected to the output of the integrator 150 by means of an inverter 160. The inverter 160 inverts the signal provided to it in such a manner that the gain factor of the first controllable amplifier 115 increases to the extent to which the gain factor of the second controllable amplifier 120 decreases or vice versa, depending on the output signal from the integrator 150. It is also conceivable for only the gain factor of one of the two controllable amplifiers 115, 120 to be controlled, while the gain factor of the second controllable amplifier 115, 120 is held at a fixed value.

That part of the measuring apparatus 100 which has been described hitherto is a push-pull measuring bridge which can be used to carry out a differential determination of values of the two complex impedances 125 and 130. A signal is output at the output 170 if the values of the complex impedances 125 and 130 differ from one another by more than a predetermined extent. In the case of the present measuring apparatus, an interfering influence which equally affects both complex impedances, for instance a temperature or ageing influence, is compensated for by the differential measurement of the values of the complex impedances 125, 130 by means of corresponding changes in the two complex impedances 125, 130.

In order to be able to use the described push-pull measuring bridge to determine a conductor carrying alternating current, the measuring apparatus 100 comprises a further circuit part which is described in more detail below and is intended to influence the second complex impedance 130 on the basis of an electromagnetic alternating field, with the result that it is possible to determine the conductor carrying alternating current.

The second complex impedance 130 can be changed using a control voltage. For example, the variable second complex impedance 130 may comprise a variable-capacitance diode, a bipolar transistor, a field effect transistor (FET) or a MOSFET for changing its impedance in a voltage-controlled manner. The control voltage for the second complex impedance 130 is provided by a probe 175 which is in the region of a conductor 180 carrying AC voltage. The conductor 180 is part of an AC voltage supply network which is operated in the high-voltage range at 110, 230 or 380 V, for example, or in the low-voltage range at approximately 6 V, 12 V or 24 V, for example. An electromagnetic field which exists in the region of the conductor 180 carrying AC voltage acts on the probe 175, with the result that an AC voltage signal can be tapped off at the probe 175 by means of a preferably high-impedance measurement. The probe 175 may comprise, in a first embodiment, an electrode 177 for picking up an electric field or, in a second embodiment, a magnetic field probe 179, for example on the basis of a Hall sensor or a variant of a GMR sensor.

The AC voltage signal is optionally restricted to a predetermined frequency range using a bandpass filter 185 and is likewise optionally amplified using an amplifier 190 before it is applied, as the control voltage, to the variable second complex impedance 130. The bandpass filter 185 may also suppress a component of the voltage provided by the probe 175, which component varies in a manner which does not correspond to a predetermined manner. This manner may comprise, for instance, a sinusoidal or square-wave variation with a predetermined duty ratio or a predetermined frequency. As is explained in more detail below with reference to FIG. 5, this suppression can be combined with the deliberate generation of a variation of the electromagnetic field in the region of the conductor 180 in the predetermined manner in order to make it easier to associate a component of an electromagnetic field determined by the probe 175 with the line 180. In further embodiments, the suppression functionality can also be effected outside the bandpass filter 185, for example by the amplifier 190.

The positions of the amplifier 190 and the bandpass filter 185 may also be interchanged. Furthermore, a rectifier (not illustrated in FIG. 1) may be provided in the signal chain between the probe 175 and the first complex impedance 125. An inverting amplifier 195 is optionally provided in order to change the second complex impedance 130 in the opposite direction to the first complex impedance 125. In a further embodiment (not illustrated), the second complex impedance 130 can also be changed using an adjusting element, with the result that a user, for example, can change the second complex impedance 130.

The bandpass filter 185 can be implemented as a combination of a high-pass filter and a low-pass filter; in an alternative embodiment, only a high-pass filter or only a low-pass filter can also be provided instead of the bandpass filter 185. Cut-off frequencies of the corresponding pass filters are selected in one embodiment in such a manner that an AC voltage signal is preferably forwarded at a frequency which corresponds to an operating frequency of the AC voltage supply network of which the conductor 180 is part. The operating frequency may be, for example, 50 Hz or 60 Hz, as is conventional in AC voltage supply networks in Europe and North America, for instance. In one embodiment, a lower cut-off frequency of the bandpass filter 185 is just below 50 Hz and an upper cut-off frequency is just above 60 Hz in order to detect both operating frequencies but to suppress differing operating frequencies.

If the probe 175 is situated in the region of the conductor 180 carrying AC voltage, the above-described push-pull measuring bridge of the elements 115 to 170 has interference by virtue of the values of the complex impedances 125, 130 being changed to a ratio which differs from a ratio which existed in the absence of the conductor 180 carrying AC voltage. The conductor 180 can be inferred from this change which can be read from the signal applied to the output 170.

Figure 2:
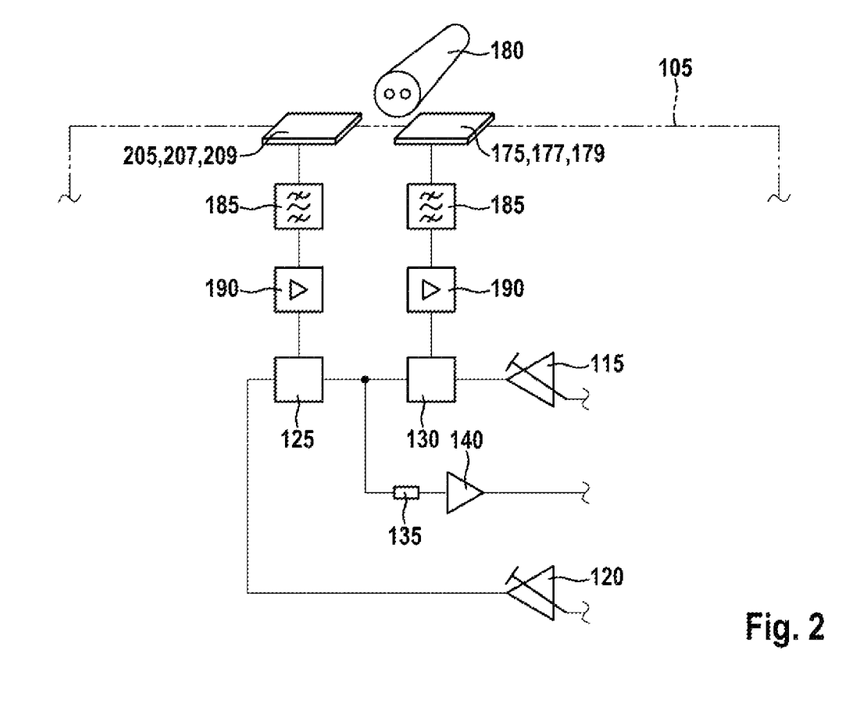
FIG. 2 shows a variation of a part of the measuring apparatus from FIG. 1.

FIG. 2 shows an alternative embodiment of a part of the measuring apparatus 100 from FIG. 1. The section to the left of the amplifiers 115, 120 and 140 in FIG. 1 is illustrated. In contrast to the embodiment illustrated in FIG. 1, the resistors 135a and 135b are replaced with a common resistor 135 here. In addition, the first complex impedance 125 is also controllable in addition to the second complex impedance 130, to be precise using a further control voltage which is provided with the aid of a further probe 205 in the region of the conductor 180 carrying AC voltage. In this case, the further probe 205 is of the same type as the probe 175, that is to say comprises a further electrode 207, if the probe 175 is an electrode 177, and a further magnetic field probe 209, if the probe 175 is a magnetic field probe 179. The further control voltage is generally preprocessed in the same manner as the control voltage described above. As explained above with reference to FIG. 1, the further control voltage can also be preprocessed using a bandpass filter 185 and an amplifier 190 and can be converted into a DC voltage using a rectifier (not illustrated).

The probes 175 and 205 are beside one another. If the cable detector 105 is moved in the horizontal direction, with the result that the probe 175 is first of all closer to the conductor 180 carrying AC voltage than the respective other probe 175, 205 and the further probe 205 is subsequently closer to said conductor than the respective other probe 175, 205, the difference between the voltages applied to the microcomputer 165 undergoes a change of sign, with respect to a previously selected reference potential, at the time at which the probes 175, 205 are at an equal distance from the conductor 180. The reference potential may be, for example, ground (0 volts) or half the operating voltage of the measuring apparatus 100. This change of sign can be detected and can be displayed to a user of the cable detector 105 using a suitable display device. As a result, the exact position of the conductor 180 can be determined with a high degree of accuracy with respect to the two probes 175, 205.

As a result of the differential measurement carried out in the embodiment from FIG. 2 using the probes 175, 205, interfering influences which equally affect both probes 175, 205 are omitted in the determination result. Such an interfering influence may be formed, for example, by elements of the cable detector 105 or the user himself who picks up a surrounding electromagnetic alternating field and emits in the region of the measuring apparatus 100.

Figure 3:
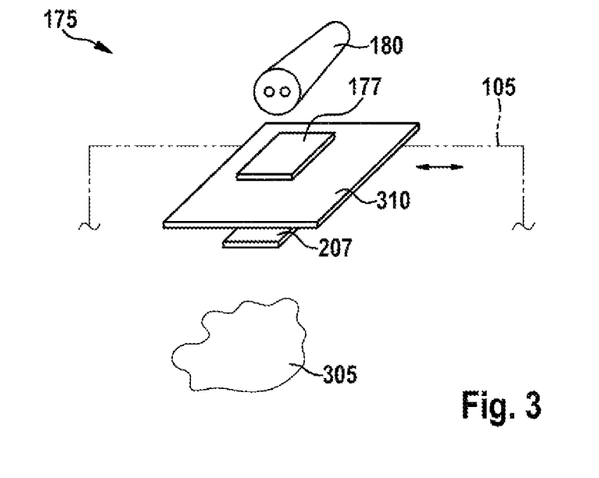
FIG. 3 shows an arrangement of electrodes on the measuring apparatus from FIG. 1 or 2.

FIG. 3 shows a probe 175 in the form of electrodes 177, 207 on the measuring apparatus 100 from FIG. 2. The electrodes 177, 207 are arranged above one another with respect to the line 180. An electrical interfering element 305 which may comprise, for example, the user of the measuring apparatus 100 is situated below the further electrode 207 on a side of the electrodes 177, 207 which faces away from the line 180. A shielding electrode 310 which has a larger area than the two electrodes 177 and 207 of the same size is arranged between the electrodes 177 and 207. The shielding electrode 310 is at a reference potential which is ground with respect to the AC voltages applied to the electrodes 177 and 207.

As described above with reference to FIG. 2, the cable detector 105 with the electrodes 177, 207 and 310 is moved past the conductor 180 in the horizontal direction. This results in the voltage profile (likewise described above) of the difference between the voltages applied to the microcomputer 165. In this case, an electrical influence of the interfering element 305 remains restricted to the further electrode 207, with the result that it is possible to distinguish between the influence of the interfering element 307 and the influence of the conductor 180.

Figure 4:
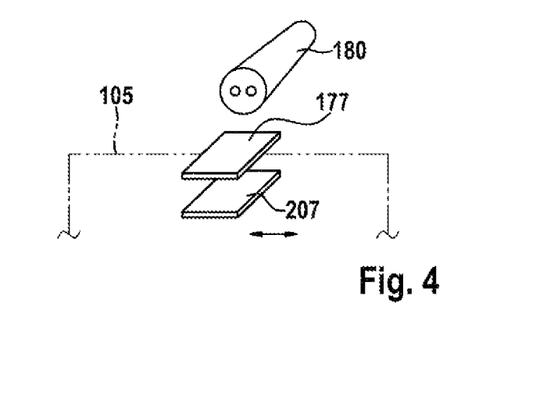
FIG. 4 shows an arrangement of electrodes on the measuring apparatus in one of FIGS. 1 to 3.

FIG. 4 shows a further arrangement of electrodes 177, 207 on the measuring apparatus 100 from FIG. 2 or 3. In contrast to the embodiment illustrated in FIG. 3, the shielding electrode 310 is dispensed with here.

Figure 5:
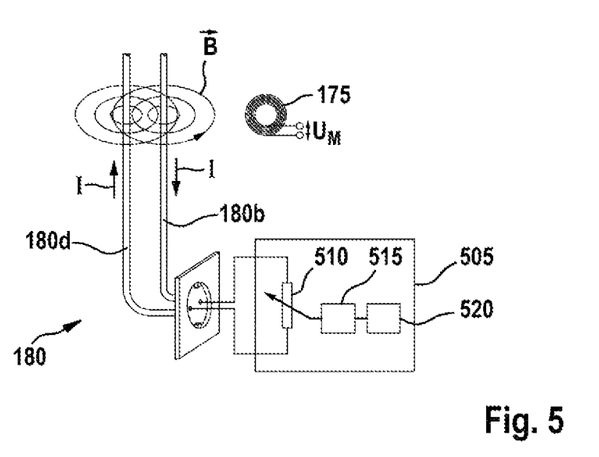
FIG. 5 shows an application module.

FIG. 5 shows an application module 505 which comprises a load module 510 which is formed as a variable resistor and is connected to a driver 515 which is controlled using a microcontroller 520. The load module 510 is connected to two electrical line cores 525a and 525b of the conductor 180 and forms an electrical load for a mains voltage present in the conductor 180, with the result that an electrical current I flows in the line cores 180a and 180b. As a result, a magnetic field B is excited or amplified in the region of the conductor 180 and is picked up in the probe 175 which is illustrated as a coil. The magnetic field B is dependent on the current I through the line cores 525a and 525b and is thus dependent on the magnitude of the electrical resistance of the load module 510.

Figure 6:
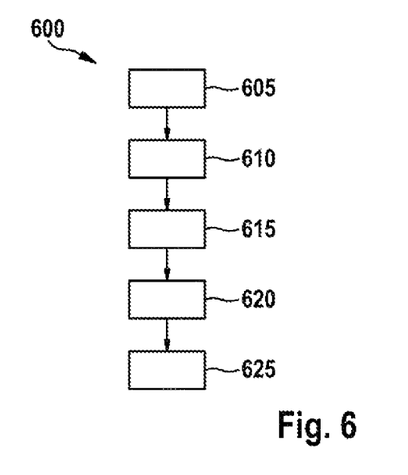
FIG. 6 shows a flowchart of a method.

FIG. 6 shows a flowchart of a method 600. In a first step 605, two phase-shifted alternating voltages are generated at first connections of the complex impedances 125 and 130 using the clock generator 110 and the controllable amplifiers 115, 120.

In a subsequent step 610, the alternating voltages are controlled in such a manner that an AC voltage component, synchronous with the alternating voltages, of the differential voltage applied to those second connections of the complex impedances 125 and 130 which are connected to one another is minimized in terms of magnitude. The push-pull measuring bridge from FIG. 1 which comprises elements 110 to 170 is balanced by this process.

In a further step 615 which can also run concurrently to steps 605 and 610, the electrode 175 is used to provide a control voltage on the basis of an electromagnetic alternating field induced by the conductor 180. This control voltage is used in a step 620 to change the second complex impedance 130.

In a subsequent step 625, the conductor 180 is detected if the push-pull measuring bridge must be balanced differently than before. In other words, the conductor 180 is detected if the ratio of the alternating voltages of the controllable amplifiers 115 and 120 does not correspond to a ratio of impedances of the complex impedances 125 and 130 in the absence of the conductor 180 carrying AC voltage.

The rebalancing or the change of the ratio of the impedances is caused by the control voltage which indicates that the electrode 175 is in the region of an electromagnetic alternating field of the conductor 180 carrying AC voltage.

The invention claimed is:

1. A measuring apparatus for detecting a conductor carrying AC voltage, the measuring apparatus comprising:
    a voltage source configured to generate two phase-shifted alternating voltages;
    two complex impedances including (i) first connections, which are connected to the alternating voltages, and (ii) second connections, which are connected to one another and to which a differential voltage is applied, a second complex impedance of the two complex impedances being changeable using a control voltage;
    a control device configured (i) to control the alternating voltages such that a component of the differential voltage which is synchronous with the alternating voltages is minimized in terms of magnitude, and (ii) to detect the conductor if a ratio of the alternating voltages does not correspond to a ratio of the two complex impedances in the absence of the conductor; and
    a probe configured to provide the control voltage on a basis of an electromagnetic alternating field induced by the conductor.

2. The measuring apparatus as claimed in claim 1, wherein the probe comprises an electrode or a magnetic field sensor.

3. The measuring apparatus as claimed in claim 1, wherein a first complex impedance of the two complex impedances is changeable, and the measuring apparatus further comprises:
    a device configured to change the first complex impedance in an opposite direction to the change in the second complex impedance.

4. The measuring apparatus as claimed in claim 3, wherein one of the two complex impedances comprises a variable-capacitance diode, a bipolar transistor, a field effect transistor or a MOSFET.

5. The measuring apparatus as claimed in claim 1, wherein the second complex impedance is changeable using a further control voltage, and the measuring apparatus further comprises:
    a further probe located in a region of the conductor carrying AC voltage, the further probe configured to provide the further control voltage.

6. The measuring apparatus as claimed in claim 1, wherein the conductor carrying AC voltage is part of an AC voltage supply network, and the measuring apparatus further comprises:
    a high-pass filter configured to suppress components of the control voltage below a cut-off frequency which is below an operating frequency of the AC voltage supply network.

7. The measuring apparatus as claimed in claim 1, wherein the conductor carrying AC voltage is part of an AC voltage supply network, and the measuring apparatus further comprises:
    a low-pass filter configured to suppress components of the control voltage above a cut-off frequency which is below an operating frequency of the AC voltage supply network.

8. The measuring apparatus as claimed in claim 1, further comprising:
    a load element configured to be connected to the conductor and is intended to generate a predetermined current through the conductor.

9. The measuring apparatus as claimed in claim 8, wherein:
    the load element is configured to vary the predetermined current in a predetermined manner, and
    the measuring apparatus is configured to use only a component of a voltage provided by the probe to provide the control voltages, which component varies in the predetermined manner.

10. A method for detecting a conductor carrying AC voltage, comprising:
    generating two phase-shifted alternating voltages at first connections of two complex impedances;
    controlling the two phase-shifted alternating voltages such that an AC voltage component, synchronous with the two phase-shifted alternating voltages, of a differential voltage applied to second connections of the complex impedances which are connected to one another, is minimized in terms of magnitude;
    providing a control voltage on a basis of an electromagnetic alternating field induced by the conductor;
    changing a second complex impedance of the two complex impedances on a basis of the control voltage; and
    detecting the conductor if a ratio of the alternating voltages does not correspond to a ratio of impedances of the two complex impedances in absence of the conductor carrying AC voltage.

11. A computer program product comprising:
    a program code device configured to carry out a method for detecting a conductor carrying AC voltage when the program code device is run on a processing device or is stored on a computer-readable data storage medium,
    wherein the method includes
        generating two phase-shifted alternating voltages at first connections of two complex impedances,
        controlling the two phase-shifted alternating voltages such that an AC voltage component, synchronous with the two phase-shifted alternating voltages, of a differential voltage applied to second connections of the complex impedances which are connected to one another, is minimized in terms of magnitude, providing a control voltage on a basis of an electromagnetic alternating field induced by the conductor, changing a second complex impedance of the two complex impedances on a basis of the control voltage, and detecting the conductor if a ratio of the alternating voltages does not correspond to a ratio of impedances of the two complex impedances in absence of the conductor carrying AC voltage.

* * * * *